(12) United States Patent
Okabe et al.

(10) Patent No.: US 10,209,592 B2
(45) Date of Patent: Feb. 19, 2019

(54) ACTIVE MATRIX SUBSTRATE, DISPLAY DEVICE AND DISPLAY DEVICE MANUFACTURING METHOD

(71) Applicant: SHARP KABUSHIKI KAISHA, Sakai, Osaka (JP)

(72) Inventors: Tohru Okabe, Sakai (JP); Hirohiko Nishiki, Sakai (JP); Takeshi Hara, Sakai (JP); Tomohiro Kosaka, Sakai (JP); Izumi Ishida, Sakai (JP); Shogo Murashige, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/743,068

(22) PCT Filed: Jul. 7, 2016

(86) PCT No.: PCT/JP2016/070179
§ 371 (c)(1),
(2) Date: Jan. 9, 2018

(87) PCT Pub. No.: WO2017/007004
PCT Pub. Date: Jan. 12, 2017

(65) Prior Publication Data
US 2018/0210306 A1 Jul. 26, 2018

(30) Foreign Application Priority Data

Jul. 9, 2015 (JP) ................................. 2015-137640
Jul. 17, 2015 (JP) ................................. 2015-143448

(51) Int. Cl.
*G02F 1/1335* (2006.01)
*G02F 1/1362* (2006.01)
(Continued)

(52) U.S. Cl.
CPC ...... *G02F 1/136286* (2013.01); *G02F 1/1333* (2013.01); *G02F 1/1335* (2013.01);
(Continued)

(58) Field of Classification Search
CPC ......... G02F 1/133512; G02F 1/136209; G02F 1/1333; G02F 1/136286; G02F 1/1368;
(Continued)

(56) References Cited

U.S. PATENT DOCUMENTS

2004/0257505 A1* 12/2004 Takizawa .......... G02F 1/133512
349/122
2012/0287080 A1* 11/2012 Akimoto .............. G02B 26/023
345/174

(Continued)

FOREIGN PATENT DOCUMENTS

JP    2013-050720 A   3/2013
WO   2007/075832 A2   7/2007

*Primary Examiner* — Jia Pan
(74) *Attorney, Agent, or Firm* — ScienBiziP, P.C.

(57) ABSTRACT

An active matrix substrate includes an insulating substrate in which light-transmitting areas and a light-shielding area are formed. The active matrix substrate further includes: a light-shielding film formed in the light-shielding area on the insulating substrate, with a transparent base material containing carbon particles, the light shielding film being colored with the carbon particles; an inorganic film formed on the light-shielding film; light-transmitting films formed in the light-transmitting areas on the insulating substrate, with a transparent base material containing transparent oxidized carbon particles; gate lines provided on the inorganic film; a gate insulating film provided on the gate lines; thin film transistors provided in matrix on the gate insulating film; and data lines provided on the light-shielding film to intersect with the gate lines. The data lines are electrically connected with the thin film transistors.

14 Claims, 15 Drawing Sheets

(51) Int. Cl.
*G02F 1/1333* (2006.01)
*G02F 1/1368* (2006.01)
*H01L 27/32* (2006.01)
*H01L 27/12* (2006.01)
*H05B 33/02* (2006.01)
*H05B 33/10* (2006.01)
*G02F 1/1343* (2006.01)

(52) U.S. Cl.
CPC ...... *G02F 1/1368* (2013.01); *G02F 1/133512* (2013.01); *G02F 1/134309* (2013.01); *G02F 1/136209* (2013.01); *H01L 27/124* (2013.01); *H01L 27/3272* (2013.01); *H01L 27/3276* (2013.01); *H05B 33/02* (2013.01); *H05B 33/10* (2013.01)

(58) Field of Classification Search
CPC ............... G02F 1/1335; H01L 27/3276; H01L 27/3272; H01L 27/124; H05B 33/02
See application file for complete search history.

(56) References Cited

U.S. PATENT DOCUMENTS

| | | | |
|---|---|---|---|
| 2013/0038641 A1* | 2/2013 | Muneyoshi | G02B 26/023 |
| | | | 345/690 |
| 2018/0239127 A1* | 8/2018 | Nishiki | B81B 3/00 |

* cited by examiner

ACTIVE MATRIX SUBSTRATE, DISPLAY DEVICE AND DISPLAY DEVICE MANUFACTURING METHOD

TECHNICAL FIELD

The present invention relates to an active matrix substrate, a display device, and a display device manufacturing method.

BACKGROUND ART

Among display devices, some include an active matrix substrate that includes thin film transistors arranged in matrix on a substrate. In recent years, oxide semiconductors having characteristics such as high mobility and low leakage current are used as thin film transistors. The range of the use of oxide semiconductors is extending to, for example, liquid crystal displays that are required to be high-definition, current-driven organic EL displays in which heavy loads are applied on thin film transistors, microelectromechanical system (MEMS) displays that are required to control actions of shutters at a high speed, and the like.

The MEMS display is a display device in which mechanical shutters are used, and for example, a transmission type MEMS display is disclosed in Patent Document 1 indicated below. In this MEMS display, on a first substrate that includes thin film transistors (hereinafter also referred to as "TFTs"), a plurality of shutter portions formed with MEMSs are arrayed in matrix so as to correspond to the pixels, respectively. On a film laminated on a first-substrate-side surface of a second substrate, a plurality of openings are provided that are arrayed in matrix so as to correspond to the pixels, respectively. When the shutter portions move, the openings are opened or closed, which cause light from a backlight unit to be transmitted toward the display surface or to be blocked, respectively.

PRIOR ART DOCUMENT

Patent Document

Patent Document 1: JP-A-2013-50720

SUMMARY OF THE INVENTION

Problem to be Solved by the Invention

In a MEMS display, typically, a light-shielding film is provided over substrate side (display viewing side) surfaces of conductive films that form gate lines, gate electrodes, and the like. In a case where no light-shielding film is provided, external light that intrudes from the display viewing side into the inside of the display device is reflected on display viewing side surfaces of conductive films having high reflectance, and this causes problems such as the reduction of contrast. To cope with this, a light-shielding film is provided, so that the problem of the contrast reduction is suppressed.

As a method for forming a light-shielding film in a light-shielding area, a method having the following steps can be considered: forming a light-shielding film on a substrate; thereafter, removing portions of the light-shielding film in areas that allow light to pass therethrough; then, forming a light-transmitting film so as to flatten the areas where the light-shielding film is removed. In the case of this method, however, the step of removing the light-shielding film from the areas that allow light to pass therethrough, and the step of forming the light-transmitting film for flattening are necessary, which causes the number of manufacturing steps to increase.

Besides, the light-shielding film is to be subjected to a step of forming thin film transistors in a layer above the light-shielding film, in which the thin film transistors are formed with use of an oxide semiconductor, which is processed at a high processing temperature and tends to be influenced by impurities and the like. The light shielding film, therefore, has to be made of a material that can withstand the above-described step of forming the thin film transistors, which is a very costly material, and this causes a significant increase in the cost of the active matrix substrate, and the cost of the display device that includes the active matrix substrate.

In order to stabilize the transistor properties of the oxide semiconductor, a high temperature annealing treatment may be applied at a temperature of 400° C. or higher (hereinafter an annealing treatment at 400° C. or higher is referred to as "high temperature annealing treatment"), for about one hour, after an oxide semiconductor layer is formed. In a case where amorphous silicon is used for thin film transistors, the highest temperature in the active matrix substrate forming process is more or less about 300° C. to 330° C. (the temperature when silicon nitride or amorphous silicon is formed); but in the active matrix substrate forming process in which oxide semiconductor is used, the above-mentioned temperature of the high temperature annealing treatment is the highest temperature. Further, since the high temperature annealing treatment is carried out for a long duration such as one hour, problems occur that did not arise in the conventional active matrix substrate forming process. For example, problems of peeling-off of the light-shielding film, cracks, and the like occur.

It is an object of the present invention to provide a technique for reducing the number of steps in a process of manufacturing an active matrix substrate, the process including the step of forming a light-shielding film.

Means to Solve the Problem

An active matrix substrate in one embodiment of the present invention is an active matrix substrate that includes an insulating substrate in which light-transmitting areas that allow light to pass therethrough, and a light-shielding area that blocks light are formed. The active matrix substrate further includes: a light-shielding film formed in the light-shielding area on the insulating substrate, with a transparent base material containing carbon particles, the light shielding film being colored with the carbon particles; an inorganic film formed on the light-shielding film; light-transmitting films formed in the light-transmitting areas on the insulating substrate, with a transparent base material containing transparent oxidized carbon particles; gate lines provided on the inorganic film; a gate insulating film provided on the gate lines; thin film transistors provided in matrix on the gate insulating film; and data lines provided on the light-shielding film so as to intersect with the gate lines, the data lines being electrically connected with the thin film transistors.

Effect of the Invention

According to the disclosure of the present embodiment, the following steps after a light-shielding film is formed on an insulating substrate are made unnecessary: a step of removing the light-shielding film from areas that allow light to pass therethrough; and a step of forming a light-transmitting film for flattening the areas from which the light-shielding film is removed. This makes it possible to reduce the number of steps in the process of manufacturing the active matrix substrate.

MODE FOR CARRYING OUT THE INVENTION

Figure 1:
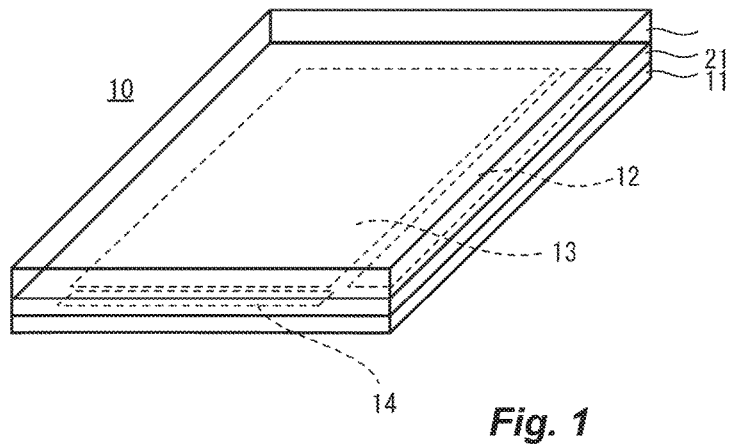
FIG. 1 is a perspective view illustrating an exemplary schematic configuration of a display device in one embodiment.

An active matrix substrate in one embodiment of the present invention is an active matrix substrate that includes an insulating substrate in which light-transmitting areas that allow light to pass therethrough, and a light-shielding area that blocks light are formed. The active matrix substrate further includes: a light-shielding film formed in the light-shielding area on the insulating substrate, with a transparent base material containing carbon particles, the light shielding film being colored with the carbon particles; an inorganic film formed on the light-shielding film; light-transmitting films formed in the light-transmitting areas on the insulating substrate, with a transparent base material containing transparent oxidized carbon particles; gate lines provided on the inorganic film; a gate insulating film provided on the gate lines; thin film transistors provided in matrix on the gate insulating film; and data lines provided on the light-shielding film so as to intersect with the gate lines, the data lines being electrically connected with the thin film transistors (the first configuration).

According to the first configuration, the light-shielding film is made of a transparent base material containing carbon particles, and the light-transmitting films is made of a transparent base material containing transparent oxidized carbon particles. Therefore, light-transmitting films can be formed in the light-transmitting areas, and the light-shielding film can be formed in the light-shielding area, by, for example, forming a dark color film on the insulating substrate with a transparent base material containing carbon particles that color the dark color film, and thereafter oxidizing the carbon particles in areas that are to become the light-transmitting areas. This makes unnecessary the following steps after a light-shielding film is formed on an insulating substrate: a step of removing the light-shielding film from areas that allow light to pass therethrough; and a step of forming a light-transmitting film for flattening the areas from which the light-shielding film is removed. This makes it possible to reduce the number of steps in the process of manufacturing the active matrix substrate. Further, a light-transmitting film for flattening is unnecessary, whereby the manufacturing cost can be reduced.

In the first configuration, each light-transmitting film may be provided exclusively between portions of the light-shielding film, in a horizontal direction of the active matrix substrate (the second configuration).

According to the second configuration, a dark color film is formed on the insulating substrate with a transparent base material containing carbon particles that color the dark color film, and thereafter the carbon particles in areas that are to become the light-transmitting areas are oxidized, whereby each light-transmitting film can be formed between portions of the light-shielding film. This makes it possible to reduce the number of steps in the process of manufacturing the active matrix substrate, and to reduce the manufacturing cost, as described above.

In the first or second configuration, the light-transmitting film may be a transparent film obtained from a part of the light-shielding film colored with the carbon particles. The transparent film may be obtained by oxidizing the carbon particles contained in the transparent base material of the light-shielding film so as to make the carbon particles transparent (the third configuration).

According to the third configuration, a dark color film is formed with a transparent base material containing carbon particles that color the dark color film, and thereafter the carbon particles in areas that are to become the light-transmitting areas are oxidized, whereby the light-transmitting films can be formed in the light-transmitting areas. This makes it possible to reduce the number of steps in the process of manufacturing the active matrix substrate, and to reduce the manufacturing cost, as described above.

In any one of the first to third configurations, in an outer peripheral portion of a display region, the light-shielding film may have an end edge that forms a surface inclined with respect to the substrate, and an angle formed between the inclined surface and the substrate may be 3° to 10° (the fourth configuration).

With the fourth configuration, even in a case where a line or the like gets onto the light-shielding film from the surface of the substrate in an outer peripheral portion of the light-shielding film, it is possible to suppress the disconnection of the line or the like.

In any one of the first to fourth configurations, the inorganic film may be formed in the light-shielding area, when viewed in a direction vertical to the active matrix substrate (the fifth configuration).

With the fifth configuration, in the manufacturing process, the carbon particles in the dark color film in the light-shielding area can be prevented from being oxidized and made transparent.

In any one of the first to fifth configurations, the thin film transistors may contain an oxide semiconductor (the sixth configuration).

A display device of the seventh configuration includes the active matrix substrate according to any one of the first to sixth configurations.

According to the seventh configuration, the following steps after a light-shielding film is formed on an insulating substrate are made unnecessary: a step of removing the light-shielding film from areas that allow light to pass therethrough; and a step of forming a light-transmitting film for flattening the areas from which the light-shielding film is removed. This makes it possible to reduce the number of steps in the process of manufacturing the display device. Further, a light-transmitting film for flattening is unnecessary, whereby the manufacturing cost of the display device can be reduced.

The seventh configuration can further include shutter mechanism parts formed in an upper layer with respect to the inorganic film, and a backlight provided so as to be opposed to the substrate, with the shutter mechanism parts being interposed therebetween. In the seventh configuration, the light-transmitting areas may be formed so as to allow light from the backlight to pass therethrough, through an opening in the shutter mechanism parts (the eighth configuration).

In the eighth configuration, the display device may be a MEMS display (the ninth configuration).

With the eighth and ninth configurations, the number of manufacturing steps and the manufacturing cost of the MEMS display can be reduced.

In the seventh configuration, the display device may be an organic electroluminescence display (the tenth configuration).

With the tenth configuration, the number of manufacturing steps and the manufacturing cost of the organic electroluminescence display can be reduced.

In the seventh configuration, the display device may be a liquid crystal display (the eleventh configuration).

With the eleventh configuration, the number of manufacturing steps and the manufacturing cost of the liquid crystal display can be reduced.

A method for manufacturing a display device in one embodiment of the present invention is a method for manufacturing a display device that includes a substrate in which, in a display region for displaying an image, light-transmitting areas that allow light to pass therethrough, and a light-shielding area that blocks light are formed. The method includes the steps of: on the substrate, forming a dark color film that is formed with a transparent base material containing carbon particles, the dark color film being colored with the carbon particles; forming an inorganic film in an area that is to become the light-shielding area, in an area on the dark color film; and oxidizing the carbon particles in areas where the inorganic film is not formed, in the dark color film, so as to make the carbon particles transparent (the twelfth configuration).

According to the twelfth configuration, the following steps after a light-shielding film is formed on the substrate are made unnecessary: a step of removing the light-shielding film from areas that allow light to pass therethrough; and a step of forming a light-transmitting film for flattening the areas from which the light-shielding film is removed. This makes it possible to reduce the number of steps in the process of manufacturing the display device. Further, a light-transmitting film for flattening is unnecessary, whereby the manufacturing cost can be reduced.

In the twelfth configuration, after the inorganic film is formed in the area that is to become the light-shielding area, the dark color film may be fired at 400° C. or higher, whereby the carbon particles are oxidized in the areas where the inorganic film is not formed, in the dark color film (the thirteenth configuration).

According to the thirteenth configuration, the dark color film is fired at 400° C. or higher. By so doing, in the dark color film, the areas where no inorganic film is formed can be made light-transmitting areas. Besides, at a step of performing the high temperature annealing treatment in the later process of manufacturing TFTs, it is possible to prevent cracks from occurring in the light-shielding film and the light-transmitting films formed by firing the light-shielding film.

In the thirteenth configuration, the transparent base material may be a resin or an SOG material having a melting point higher than a firing temperature in the third step (the fourteenth configuration).

[Embodiment]

The following description describes embodiments of the present invention in detail, while referring to the drawings. Identical or equivalent parts in the drawings are denoted by the same reference numerals, and the descriptions of the same are not repeated. To make the description easy to understand, in the drawings referred to hereinafter, the configurations are simply illustrated or schematically illustrated, or the illustration of part of constituent members is omitted, in some cases. Further, the dimension ratios of the constituent members illustrated in the drawings do not necessarily indicate the real dimension ratios.

The following description describes an embodiment in which the method for manufacturing a display device according to the present invention is applied to a transmission type microelectromechanical system (MEMS) display.

Figure 2:
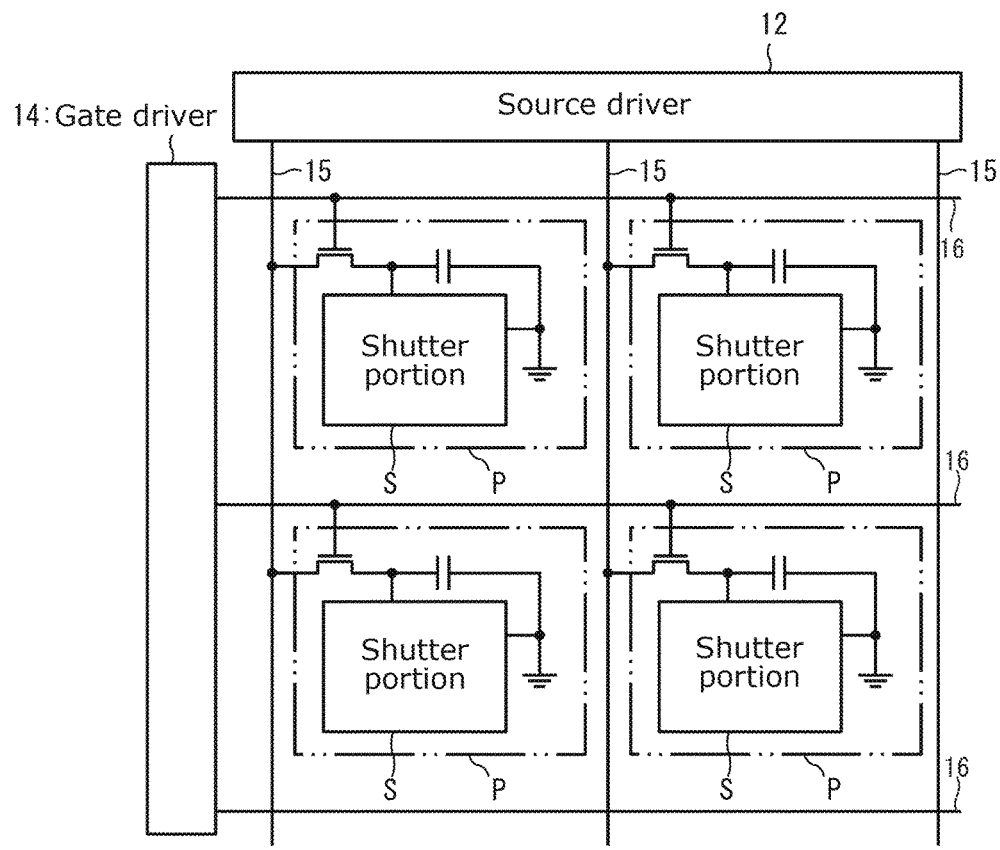
FIG. 2 is an equivalent circuit diagram regarding an area of a part of the display device.

FIG. 1 is a perspective view illustrating an exemplary schematic configuration of a display device 10 in one embodiment. FIG. 2 is an equivalent circuit diagram regarding an area of a part of the display device 10.

The display device 10 has a configuration in which a first substrate 11, a second substrate 21, and a backlight 31 are laminated in the stated order. The first substrate 11 is an active matrix substrate, and the second substrate 21 is a counter substrate.

On the first substrate 11, a display region 13 in which a plurality of pixels P for displaying images are arranged is provided. As is described below, the display region 13 includes light-transmitting areas that allow light to pass therethrough, and a light-shielding area at which light is blocked. On the first substrate 11, there are further provided a source driver 12 and a gate driver 14 that supply control signals for controlling the transmission of light at each pixel P. The second substrate 21 is provided so as to cover the backlight surface of the backlight 31.

The backlight 31 includes, for example, a red color (R) light source, a green color (G) light source, and a blue color (B) light source so as to project back light to each pixel P. The backlight 31, based on backlight control signals input thereto, causes a certain light source to emit light. The light source is, for example, a cold-cathode tube (CCFL), an LED light source, an organic EL light source, an inorganic EL light source, or the like.

As illustrated in FIG. 2, on the first substrate 11, a plurality of data lines 15 and a plurality of gate lines 16 are provided. Each data line 15 extends in a first direction, and a plurality of the data lines 15 are arrayed at predetermined intervals in a second direction that intersects at a right angle with the first direction. Each gate line 16 extends in the second direction, and a plurality of the gate lines 16 are arrayed at predetermined intervals in the first direction.

The pixels P are formed in areas divided by the data lines 15 and the gate lines 16. Each pixel P is provided with a shutter mechanism part S that is described below.

Each data line 15 is connected to the source driver 12, and each gate line 16 is connected to the gate driver 14. The gate driver 14 sequentially inputs, to each gate line 16, a gate signal that switches the gate line 16 to a selected state or a non-selected state, thereby scanning the gate lines 16. The source driver 12 inputs data signals to each data line 15 in synchronization with the scanning of the gate lines 16. This causes desired signal voltages to be applied to respective shutter mechanism parts S of the pixels P connected to the selected gate line 16.

Figure 3:
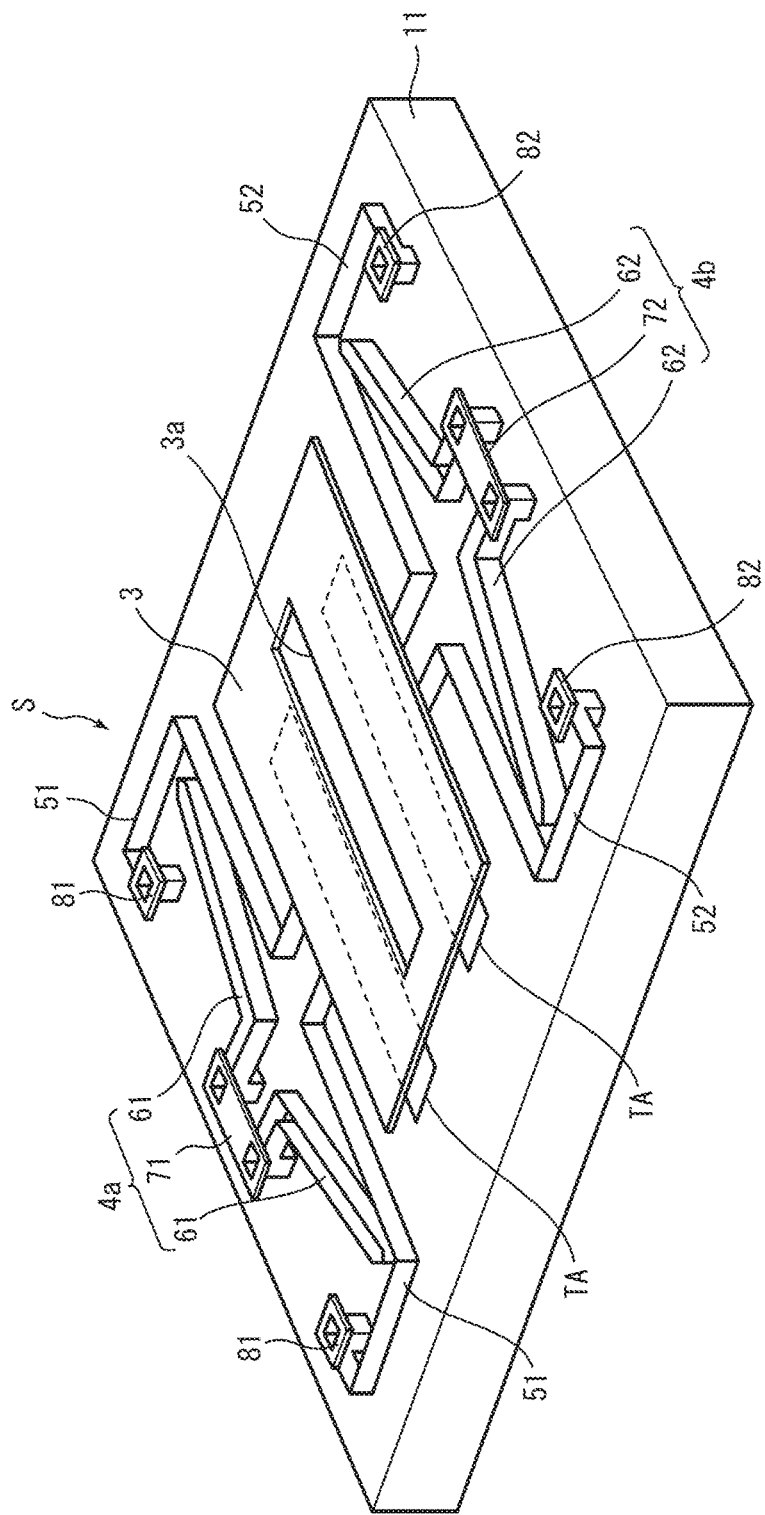
FIG. 3 is a perspective view illustrating a detailed exemplary configuration of a shutter mechanism part at one pixel.

FIG. 3 is a perspective view illustrating a detailed exemplary configuration of the shutter mechanism part S at one pixel P. The shutter mechanism part S includes a shutter body 3, a first electrode portion 4a, and a second electrode portion 4b.

The shutter body 3 has a plate-like shape. In FIG. 3, for convenience sake of illustration, the shutter body 3 is illustrated as having a flat plate shape, but actually, as illustrated in the cross-sectional views in FIGS. 5 and 7 to be described below, the shutter body 3 has a shape having folds in the lengthwise direction (long side direction) of the shutter body 3. The direction vertical to the lengthwise direction of the shutter body 3, that is, the transverse direction (short side direction), is a direction in which the shutter body 3 is driven (movement direction).

The shutter body 3 has an opening 3a that extends in the lengthwise direction. The opening 3a is formed in a rectangular shape having long sides extending in the lengthwise direction of the shutter body 3.

To the shutter body 3, one-side ends of shutter beams 51 and 52 are connected. The other-side ends of the shutter beams 51 and 52 are connected to the shutter beam anchors 81 and 82 as support portions fixed to the first substrate 11, respectively. The shutter beams 51 and 52 are elastically deformable.

The first shutter beam 51 is connected to one side end in the driving direction of the shutter body 3, and the second shutter beam 52 is connected to the other side end in the driving direction of the shutter body 3. In other words, the second shutter beam 52 is connected to an end of the shutter body 3 on the side opposite to the end thereof to which the first shutter beam 51 is connected. In this example, two shutter beams, i.e., the first shutter beam 51 and the second shutter beam 52, are connected to two long sides of the shutter body 3, respectively. The shutter beams 51 and 52 extend from the connection parts of the shutter body 3 outward, and are connected to the shutter beam anchors 81, 82, respectively.

In this way, the shutter beams 51 and 52 connect the shutter beam anchors 81, 82 fixed to the first substrate 11, and the shutter body 3 with each other. Since the shutter beams 51 and 52 have flexibility, the shutter body 3 is supported in a movable state with respect to the first substrate 11. Further, the shutter body 3 is electrically connected with lines (not shown) provided on the first substrate 11, via the shutter beam anchors 81, 82 and the shutter beams 51 and 52.

The driving beams 61, 62 are provided so as to be adjacent to the shutter body 3, on the sides of the shutter body 3 in the driving direction, respectively. The first driving beam 61 is provided so as to be opposed to one side end in the driving direction of the shutter body 3, and the second driving beam 62 is provided so as to be opposed to the other side end in the diving direction of the shutter body 3. In other words, the driving beams 61, 62 are arranged at positions opposed to the shutter beams 51 and 52 connected to the shutter body 3.

Ends of the driving beams 61, 62 are connected to the driving beam anchors 71, 72 fixed to the first substrate 11, respectively. The driving beams 61, 62 are electrically connected with lines (not shown) provided on the first substrate 11, via the driving beam anchors 71, 72, respectively. Here, as one example, the first driving beam 61 is formed with a pair of driving beams, but the first driving beam 61 can be formed with one driving beam, and so can the second driving beam 62.

The first electrode portion 4a is composed of the first driving beam 61 and the first driving beam anchor 71. Further, the second electrode portion 4b is composed of the second driving beam 62 and the second driving beam anchor 72. To the first electrode portion 4a and the second electrode portion 4b, predetermined voltages are applied, as is described below.

The first substrate 11 has light-transmitting areas TA that allow light to pass therethrough. In the example illustrated in FIG. 3, two light-transmitting areas TA are provided per one pixel in the first substrate 11. The light-transmitting area TA has a rectangular shape corresponding to the opening 3a of the shutter body 3. The two light-transmitting areas TA are arranged so as to be arrayed in the transverse direction of the shutter body 3. In a case where no electric force is exerted between the shutter body 3 and the first electrode portion 4a, and between the shutter body 3 and the second electrode portion 4b, the opening 3a of the shutter body 3 is in a state of not overlapping with any light-transmitting area TA.

In the present embodiment, the driving circuit that controls the shutter mechanism part S supplies potentials having different polarities to the first electrode portion 4a and the second electrode portion 4b, respectively, the polarities varying at intervals of fixed time. Further, the driving circuit that controls the shutter mechanism part S supplies a fixed potential having a positive polarity or a negative polarity to the shutter body 3.

Figure 4:
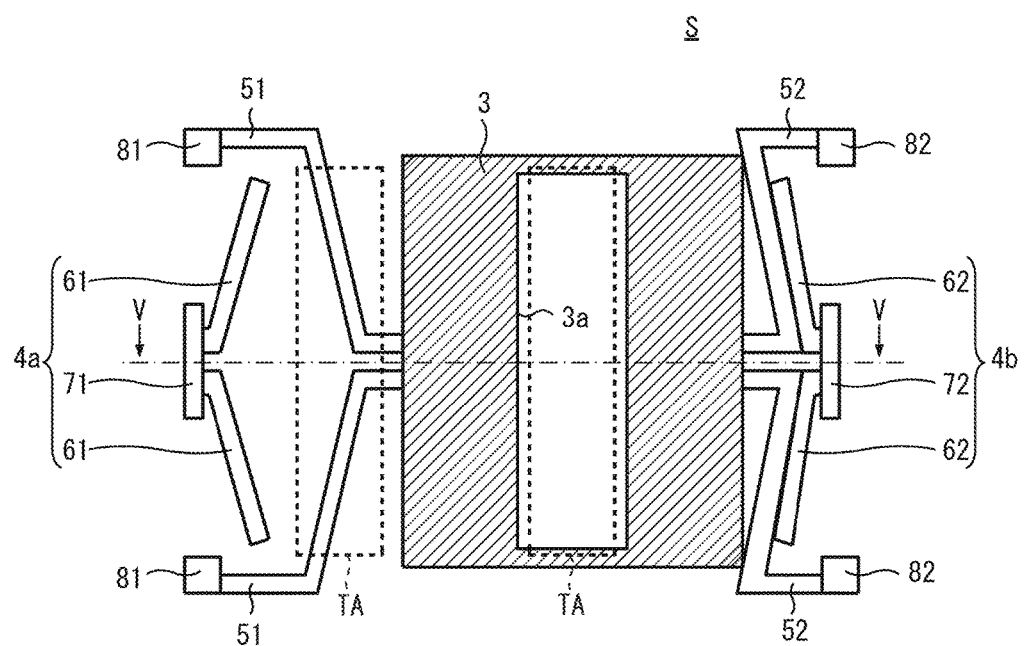
FIG. 4 is a plan view of the shutter mechanism part.
Figure 5:
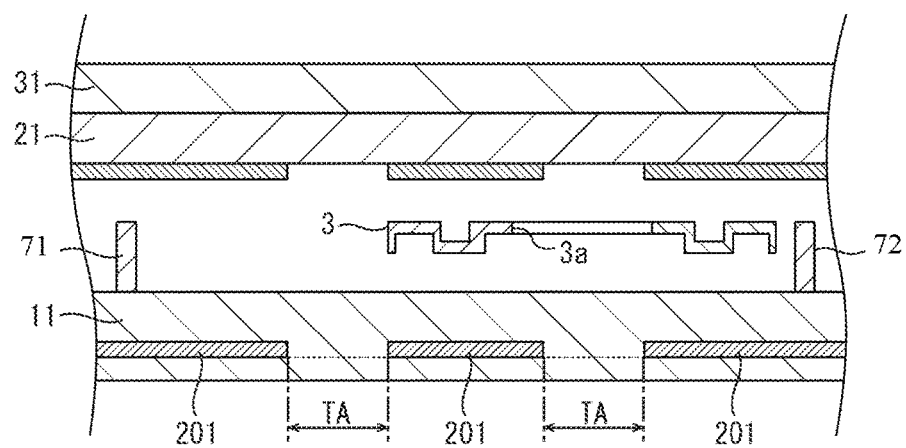
FIG. 5 is a cross-sectional view taken along line V-V in FIG. 4.

The following description describes an exemplary case where a potential at a high (H) level is supplied to the shutter body 3. When the driving beam 61 of the first electrode portion 4a has a potential at H level and the driving beam 62 of the second electrode portion 4b has a potential at low (L) level, electrostatic force causes the shutter body 3 to move toward the side of the second electrode portion 4b having a potential at L level. As a result, as illustrated in FIGS. 4 and 5, the opening 3a of the shutter body 3 overlaps one of the two light-transmitting areas TA of the first substrate 11, whereby the state shifts to an opened state in which light of the backlight 31 passes toward the first substrate side. FIG. 4 is a plan view illustrating the shutter mechanism part S, and FIG. 5 is a cross-sectional view taken along line V-V in FIG. 4. Further, FIG. 5 also illustrates a light-shielding film 201 to be described below, provided on the first substrate 11.

Figure 6:
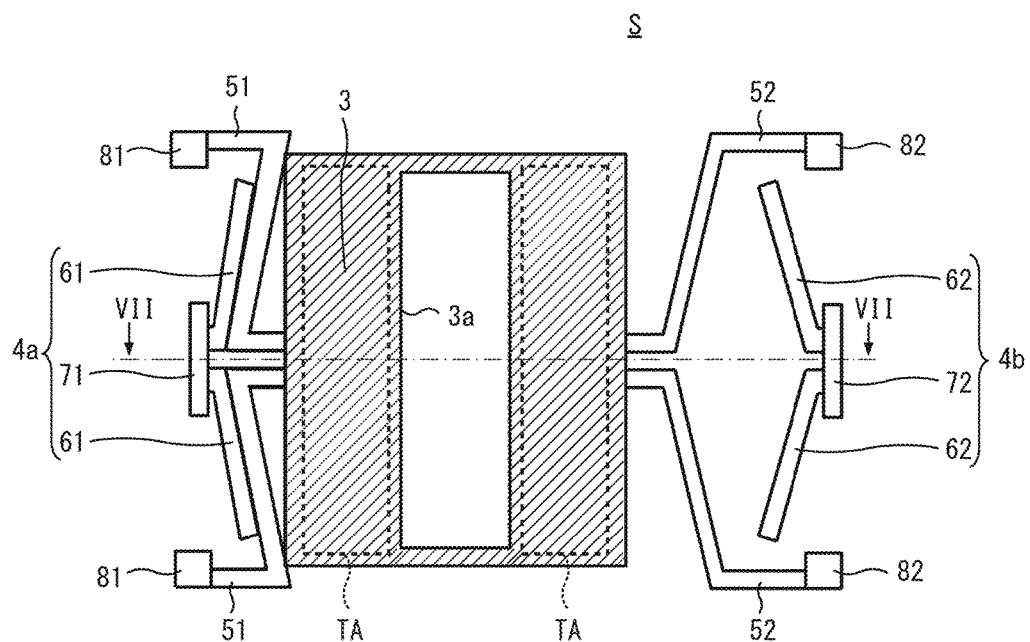
FIG. 6 is a plan view illustrating the shutter mechanism part.
Figure 7:
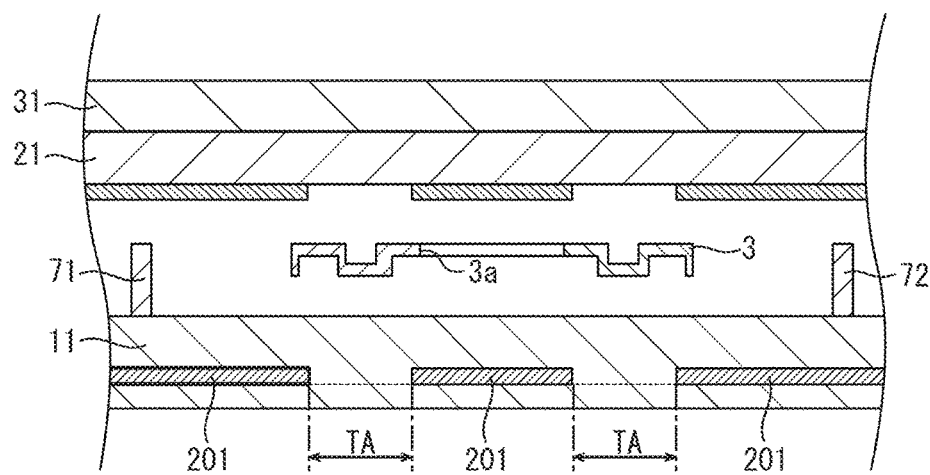
FIG. 7 is a cross-sectional view taken along line VII-VII in FIG. 6.

On the other hand, when the potential of the first electrode portion 4a is at L level and the potential of the second electrode portion 4b is at H level, the shutter body 3 moves toward the first electrode portion 4a side. With this, the portion other than the opening 3a of the shutter body 3 overlaps with the light-transmitting area TA, as illustrated in FIGS. 6 and 7. In this case, the state shifts to a closed state in which light from the backlight 31 does not pass toward the first substrate 11 side. FIG. 6 is a plan view illustrating the shutter mechanism part S, and FIG. 7 is a cross-sectional view taken along line VII-VII in FIG. 6. Further, FIG. 7 also illustrates a light-shielding film 201 provided on the first substrate 11, to be described below.

In the shutter mechanism part S of the present embodiment, therefore, the shutter body 3 is moved by controlling the potentials of the shutter body 3, the first electrode portion 4a, and the second electrode portion 4b, whereby the opened state and the closed state of the light-transmitting area TA of the first substrate 11 are switched from one to the other. In a case where a potential at L level is supplied to the shutter body 3, the shutter body 3 makes an operation reverse to that described above.

(First Substrate)

Figure 8:
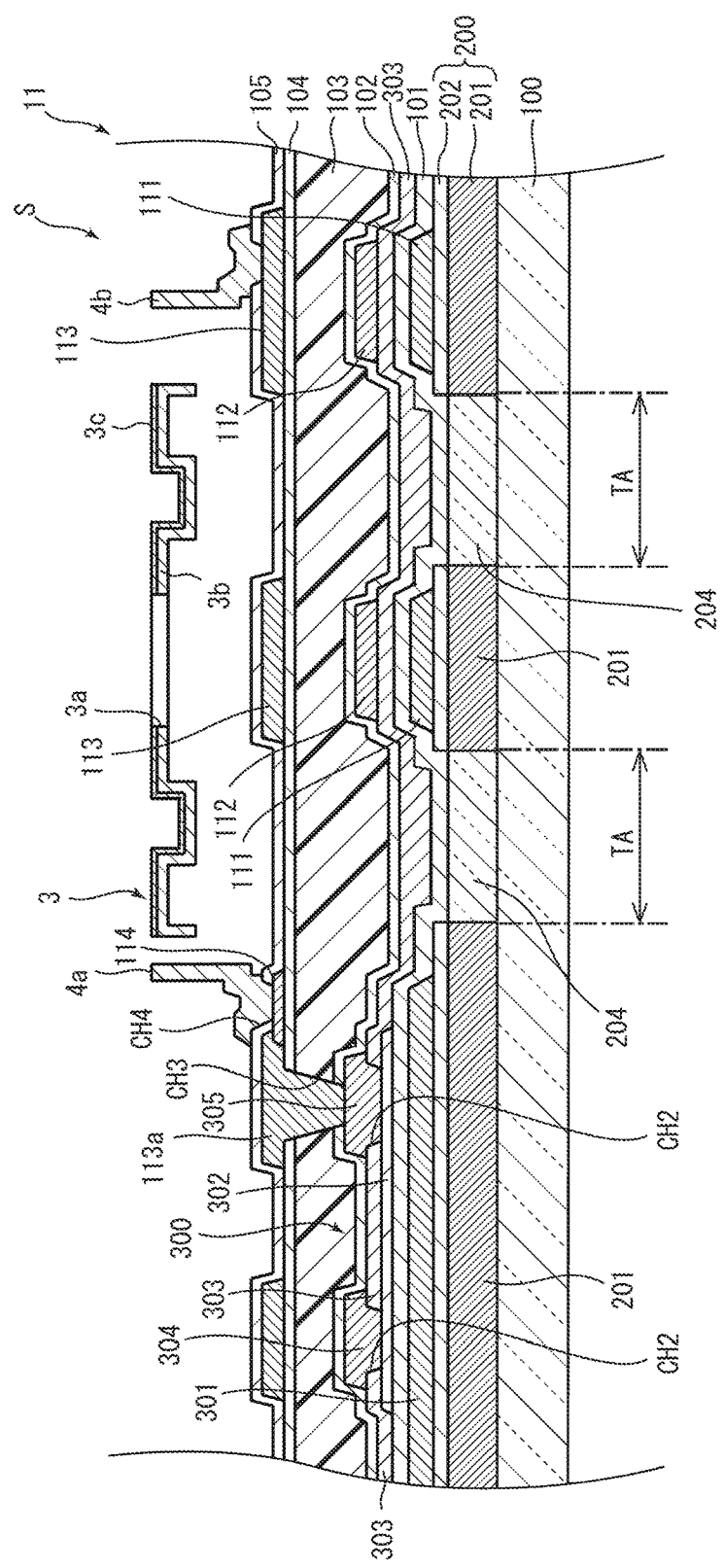
FIG. 8 is a cross-sectional view of a first substrate.

FIG. 8 is a cross-sectional view of the first substrate 11.

The first substrate 11 has such a configuration that a light-shielding layer 200, TFTs 300, and shutter mechanism parts S are formed on a translucent substrate (for example, a glass substrate) 100 as an insulating substrate. The TFTs 300 and the shutter mechanism parts S are arranged in matrix on the translucent substrate 100. In FIG. 8, one TFT is illustrated, but, actually, a plurality of TFTs are included in a single pixel P. The light-shielding section 200 includes the light-shielding film 201 and a transparent insulating film 202.

Each TFT 300 includes a gate electrode 301, an oxide semiconductor film 302, an etching stopper layer 303, a source electrode 304, and a drain electrode 305.

Figure 9:
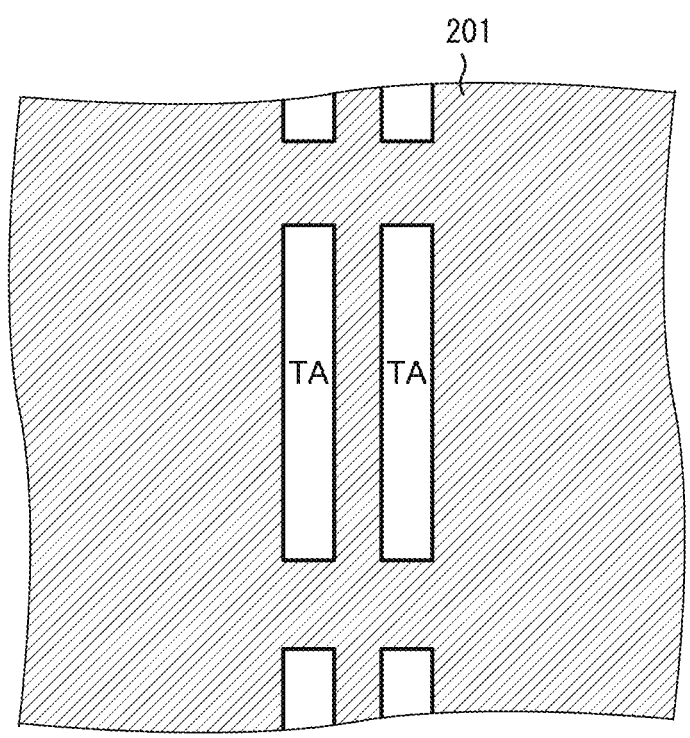
FIG. 9 is a plan view illustrating a light-shielding film.

The light-shielding film 201 is provided on the translucent substrate 100. As illustrated in FIG. 9, the light-shielding film 201 is formed so as to cover the display region 13 other than the light-transmitting areas TA. This makes it possible to prevent external light that has advanced from the display viewing side into the display device 10 from advancing toward the second substrate 21 side beyond the light-shielding film 201.

The light-shielding film 201 is formed with a material that hardly reflects light. This makes it possible to prevent external light that has advanced from the display viewing side into the display device 10 from being reflected by the light-shielding film 201 and going back to the display viewing side. Further, the light-shielding film 201 is formed with the material having a high resistance. This makes it possible to prevent a great parasitic capacitance from being generated between the light-shielding film 201 and conductive films forming the TFTs 300 and the like. Still further, since the light-shielding film 201 is formed prior to the TFT manufacturing process, it is necessary to select, as a material for the light-shielding film 201, a material that has less influence to TFT properties in the subsequent TFT manufacturing process, and that withstands the subsequent TFT manufacturing process. Examples of the material of the light-shielding film 201 that satisfies such requirements include, for example, a high-melting-point resin film (polyimide, etc.), and a spin-on-glass (SOG) film, colored in a dark color by containing carbon particles (carbon black).

Light-transmitting films 204 are provided in areas where the light-shielding film 201 is not formed, that is, exclusively in areas between portions of the light-shielding film 201, in the horizontal direction of the active matrix substrate. The light-transmitting film 204 is formed with, for example, a coating-type material. The coating-type material means a material that, when applied, can be formed in a film form. Specifically, the light-transmitting film 204 is formed with, for example, a transparent high-melting-point resin film (polyimide, etc.), an SOG film, or the like. In the present embodiment, the base material for the light-shielding film 201, and the base material for the light-transmitting film 204, are identical to each other.

Figure 10:
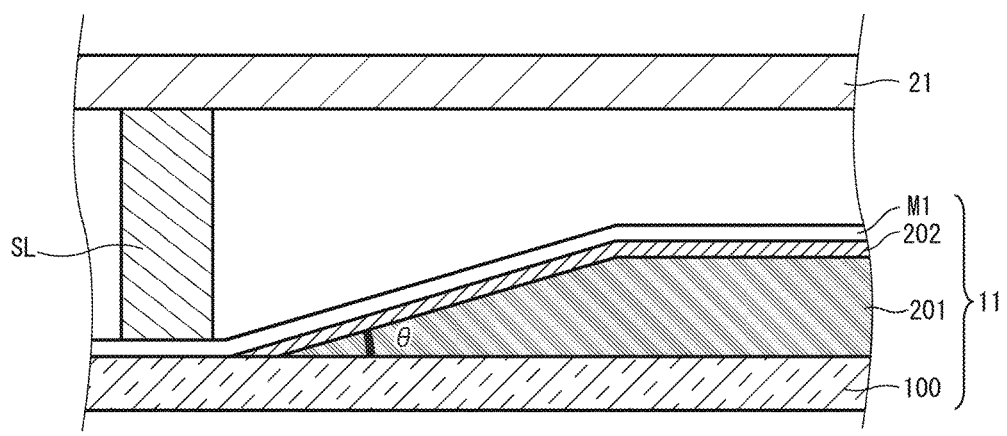
FIG. 10 is a cross-sectional view illustrating a peripheral portion of the light-transmitting film.
Figure 11:
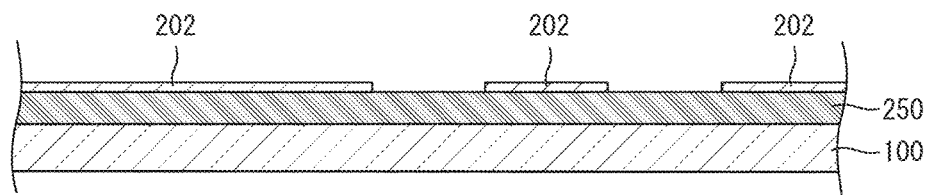
FIG. 11 is a diagram for explaining a method for manufacturing the first substrate.
Figure 12:
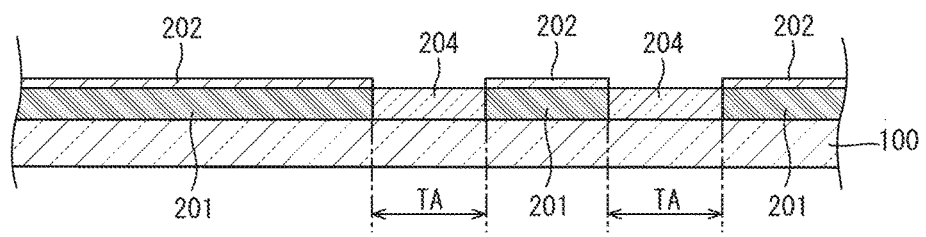
FIG. 12 is a diagram for explaining a method for manufacturing the first substrate, illustrating a state subsequent to the state illustrated in FIG. 11.

FIG. 10 is a cross-sectional view illustrating a peripheral portion of the light-shielding film 201. The light-shielding film 201, in an outer peripheral portion of the display region 13, has a film thickness gradually decreasing as the proximity to the display region 13 decreases, as illustrated in FIG. 10. In other words, in the outer peripheral portion of the display region 13, the surface of the light-shielding film 201 forms a surface inclined with respect to the translucent substrate 100. The angle θ formed between this inclined surface and the translucent substrate 100 is preferably smaller than 20°. The angle θ is more preferably 3° to 10°.

Further, as illustrated in FIG. 10, an end edge of the light-shielding film 201 is covered with the transparent insulating film 202, which is an inorganic film.

Incidentally, as illustrated in FIG. 10, the first substrate 11 and the second substrate 21 are bonded to each other at peripheral portions of the display region 13, with a sealing member SL, and a space formed between the substrates 11, 21 is encapsulated therebetween with the sealing member SL. The sealing member SL is arranged on an outer circumference side with respect to the light-shielding film 201, so as not to overlap with the inclined surface of the light-shielding film 201.

In the outer peripheral portion of the light-shielding film 201, the surface of the end edge portion of the light-shielding film 201 forms a surface inclined with respect to the translucent substrate 100, the angle θ formed between the inclined surface and the surface of the translucent substrate 100 is smaller than 20°. Therefore, even in a case where lines and the like get onto the light-shielding film 201 from the surface of the translucent substrate 100, it is possible to prevent the lines (in FIG. 10, the lines formed with first conductive films M1 that is described below) from becoming disconnected. The disconnection of lines can be prevented, not only in the case of the lines formed with the first conductive films M1, but also in the case of lines formed with second conductive films M2 or third conductive films M3 that are described below, similarly. The lines are connected with a terminal part that is formed outside the display region, on an outer side with respect to the sealing member SL. Further, since the surface of the light-shielding film 201 forms a surface inclined with respect to the translucent substrate 100 and the angle θ formed between the inclined surface and the translucent substrate 100 is smaller than 20°, it is possible to prevent cracks from occurring in the light-shielding film 201 at the high temperature annealing step in the TFT manufacturing process.

On the upper surface of the light-shielding film 201, the transparent insulating film 202 is provided. With the transparent insulating film 202 thus provided, in a manufacturing process to be described below, a dark color material such as carbon particles (carbon black) in the light-shielding film 201 and the like is prevented from becoming oxidized by high temperature annealing and making the light-shielding film 202 transparent.

The gate electrode 301 is formed with the first conductive film M1. The first conductive film M1s form, not only the gate electrode 301 of the TFTs 300, but also the lines 111 and the like. The line 111 is, for example, a gate line. Further, the source electrode 304 and the drain electrode 305 are formed with the second conductive films M2. The second conductive films M2 form, not only the source electrodes 304 and the drain electrodes 305 of the TFTs 300, but also the lines 112 and the like.

The oxide semiconductor film 302 may contain, for example, at least one kind of metal element among In, Ga, and Zn. In the present embodiment, the oxide semiconductor film 302 contains, for example, an In—Ga—Zn—O-based semiconductor. Here, the In—Ga—Zn—O-based semiconductor is a ternary oxide of indium (In), gallium (Ga), and zinc (Zn), in which the ratio (composition ratio) of In, Ga, and Zn is not limited particularly. Examples of the composition ratio of the In—Ga—Zn—O-based semiconductor include In:Ga:Zn=2:2:1, In:Ga:Zn=1:1:1, In:Ga:Zn=1:1:2 and the like. Such an oxide semiconductor film 302 can be formed with an oxide semiconductor film that contains an In—Ga—Zn—O-based semiconductor. The channel-etch type TFT having an active layer that contains an In—Ga—Zn—O-based semiconductor is referred to as "CE-In-GaZnO-TFT" in some cases. The In—Ga—Zn—O-based semiconductor may be amorphous, or alternatively, may be crystalline. The crystalline In—Ga—Zn—O-based semiconductor is preferably a crystalline In—Ga—Zn—O-based semiconductor in which the c-axis is aligned approximately vertically to the layer surface.

The gate electrode 301 is covered with the gate insulating film 101. The source electrodes 304 and the drain electrodes 305 are covered with a passivation film 102. The passivation film 102 is further covered with a flattening film 103 and a passivation film 104. The TFT 300 contains an oxide semiconductor, and has a conventionally known configuration.

In the passivation film 102, the flattening film 103, and the passivation film 104, there is provided a contact hole CH3 that reaches the drain electrode 305. On the passivation film 104, lines 113 are formed. A part 113a of the line 113 is provided so as to cover a surface of the contact hole CH3, and is electrically connected with a drain electrode 305. The lines 113 are formed with third conductive films M3. The lines 113 are connected to the first electrode portions 4a, the second electrode portions 4b, the shutter bodies 3 and the like of the shutter portions S. The parts 113a of the lines 113 may be electrically connected with the transparent conductive films 114 provided on the surface of the passivation film 104. The lines 113 are covered with a passivation film 105.

On the passivation film 105, there are provided the shutter mechanism part S. The configuration of the shutter mechanism part S is as mentioned above. The shutter body 3 has a configuration in which the shutter main body 3b on the translucent substrate 100 side and a metal film 3c are laminated.

(Manufacturing Method)

The following description describes a method for manufacturing the display device 10 in one embodiment, while referring to FIGS. 11 to 19.

First, a dark color film 250 is formed on the translucent substrate 100 by the spin coating method. The dark color film 250 has a thickness of, for example, 0.5 μm to 3 μm. The dark color film 250 is formed with a heat-resistant transparent base material that contains carbon particles (carbon black), with which the dark color film 250 is colored in a dark color. The heat-resistant transparent base material is, for example, a high melting point resin (polyimide, etc.) or an SOG material, having a melting point that is higher than the temperature at which a high temperature annealing treatment to be described below is performed. The SOG material is, for example, a siloxane-based resin. Here, a taper shape as illustrated in FIG. 10 can be formed in an outer peripheral portion of the light-transmitting film 204 by performing the patterning with use of a gray tone mask or the patterning without use of a mask. In a light-shielding area that does not allow light to pass therethrough, in the area over the dark color film 250, a transparent insulating film 202 is formed (see FIG. 11). The transparent insulating film 202 is, for example, an inorganic film such as an $SiO_2$ film or an $SiN_x$ film. The transparent insulating film 202 has a thickness of, for example, 50 to 200 nm.

The following description briefly describes a method for forming the transparent insulating film 202 in the light-shielding area on the dark color film 250. For example, an inorganic film such as an $SiO_2$ film or an SiNx film is formed on the dark color film 250 by a method such as the chemical vapor deposition (CVD) method or sputtering, is patterned by photolithography, and then, is dry-etched, whereby the transparent insulating film 202 is formed in the light-shielding area.

Subsequently, a high temperature annealing treatment is performed in a nitrogen atmosphere. The temperature at which the high temperature annealing treatment is carried out is, for example, 400 to 500° C. The high temperature annealing time is, for example, about one hour. The high temperature annealing treatment, however, may be performed in an ambient atmosphere, instead of a nitrogen atmosphere.

By performing the high temperature annealing treatment, in the dark color film 250, in portions thereof whose upper parts are not covered with the transparent insulating film (inorganic film) 202, carbon particles are oxidized, whereby these portions of the dark color film 250 become transparent. This causes the portions of the dark color film 250, whose upper parts are not covered with the transparent insulating film 202, become the light-transmitting films 204 illustrated in FIG. 8. On the other hand, in the dark color film 250, portions thereof whose upper parts are covered with the transparent insulating film (inorganic film) 202 remain the dark color film, with the carbon particles being not oxidized. In other words, in the dark color film 250, the portions thereof whose upper parts are covered with transparent insulating film 202 become the light-shielding film 201 illustrated in FIG. 8 (see FIG. 12).

Further, with the high temperature annealing treatment, the occurrence of cracks to the light-shielding film 201 and the light-transmitting films 204 is suppressed, in the step of the high temperature annealing treatment in the manufacture of TFTs 300, which is performed later.

The above-described temperature at which the high temperature annealing treatment is performed, which is described above, is preferably at or above the temperature of the treatment in the subsequent process of manufacturing the TFTs 300 (the temperature for film formation by CVD, or the annealing temperature). The high temperature annealing treatment performed at a temperature at or above the temperature of the treatment in the process of manufacturing the TFTs 300 prevents moisture and the like contained in the light-transmitting film 204 from oozing out into the TFTs 300 and causing failures of the TFTs 300.

Figure 20:
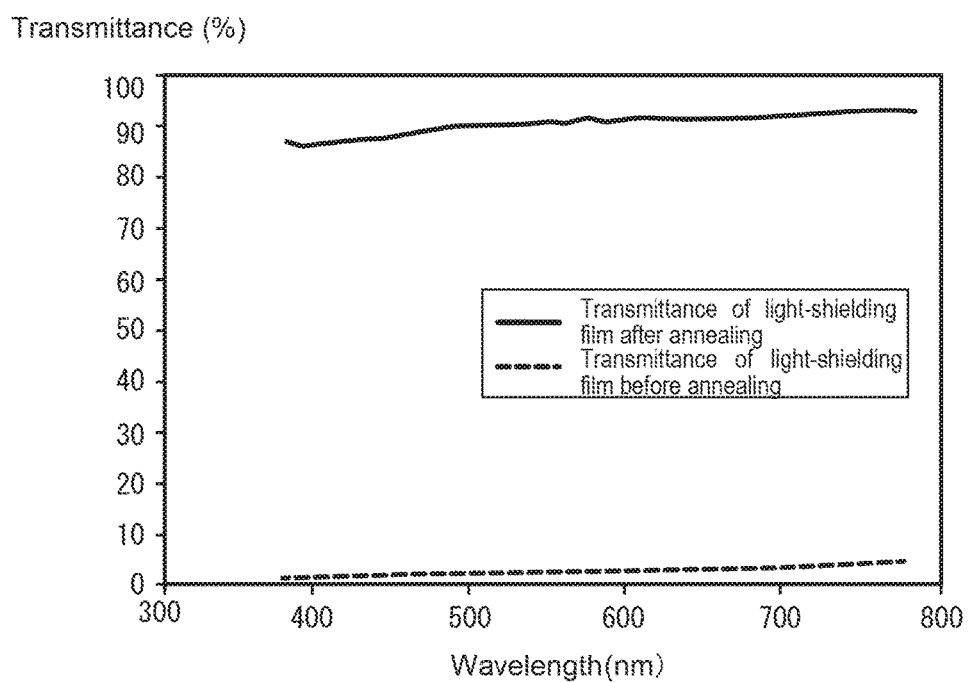
FIG. 20 illustrates values of transmittance of a dark color film before and after a high temperature annealing treatment is carried out with respect to the dark color film, the dark color film being formed with a heat-resistant transparent base material containing carbon particles, thereby being colored in dark color.

FIG. 20 illustrates values of transmittance before and after the above-described high temperature annealing treatment is carried out with respect to the dark color film 250 not covered with any inorganic film. In FIG. 20, the horizontal axis indicates the wavelength (nm) of light projected, and the vertical axis indicates the transmittance (%). The transmittance of the dark color film 250 before annealing is indicated by the broken line, and the transmittance of the dark color film 250 after annealing is indicated by the solid line.

As illustrated in FIG. 20, the transmittance of the dark color film 250 before annealing exhibits low values of 5% or lower, in a range of the wavelength of projected light of 400 to 750 (nm), which means that the dark color film before annealing has sufficient light shielding properties. On the other hand, the transmittance of the dark color film 250 after annealing is about 85% or more, sometimes 90% or more depending on the wavelength of light, in a range of wavelength of projected light of 400 to 750 (nm), which means that the dark color film 250 after annealing has sufficient light transmissivity.

Figure 13:
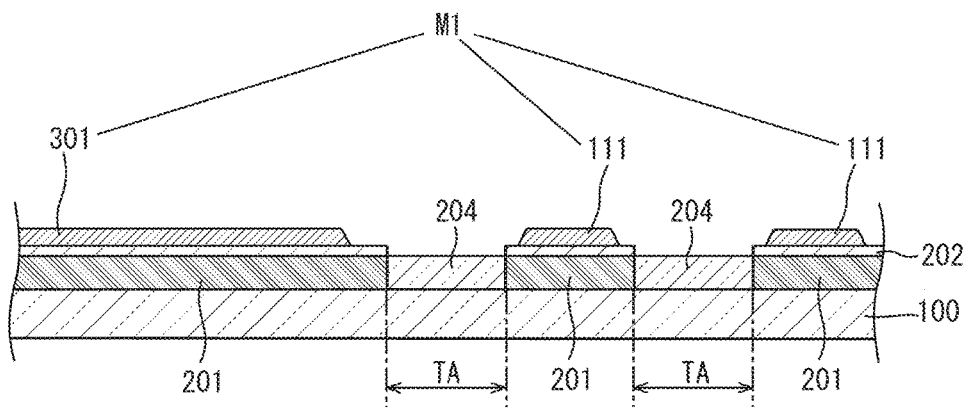
FIG. 13 is a diagram for explaining a method for manufacturing the first substrate, illustrating a state subsequent to the state illustrated in FIG. 12.

Next, a single layer film or a laminate film composed of any of a metal film such as an aluminum (Al) film, a tungsten (W) film, a molybdenum (Mo) film, a tantalum (Ta) film, a chromium (Cr) film, a titanium (Ti) film, a copper (Cu), or the like, or a film containing an alloy of any of the foregoing metals, is laminated by the sputtering method, and is patterned, whereby the first conductive films M1 are formed. As described above, the first conductive films M1 include the gate electrode 301 and the line 111 (FIG. 13). The first conductive films M1 have a thickness of, for example, about 50 nm to 500 nm.

Figure 14:
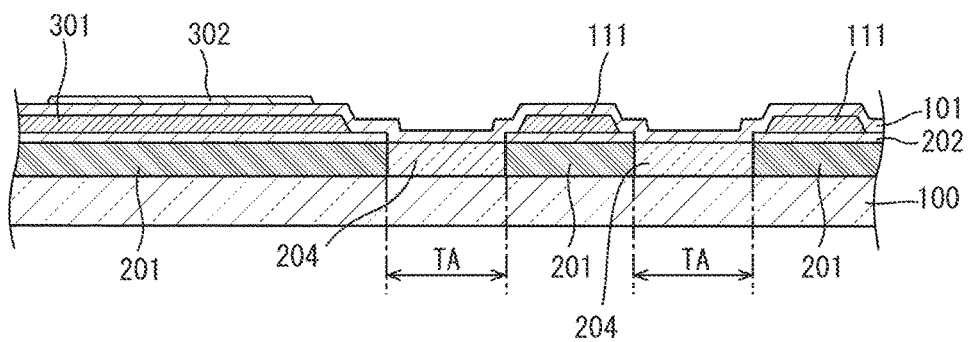
FIG. 14 is a diagram for explaining a method for manufacturing the first substrate, illustrating a state subsequent to the state illustrated in FIG. 13.

Next, as illustrated in FIG. 14, an $SiN_x$ film is formed by the plasma enhanced chemical vapor deposition (PECVD) method so as to cover the first conductive films M1, whereby a gate insulating film 101 is formed. The gate insulating film 101 may be a silicon-based inorganic film containing oxygen ($SiO_2$ film or the like), a laminate film of an $SiO_2$ film and an $SiN_x$ film, or the like. The obtained gate insulating film 101 has a thickness of, for example, 100 nm to 500 nm.

Next, an oxide semiconductor film is formed by, for example, the sputtering method. Then, the oxide semiconductor film is patterned, whereby the oxide semiconductor films 302 are formed in areas corresponding to the thin film transistors. (see FIG. 14)

Subsequently, the oxide semiconductor film 302 thus formed is subjected to a high temperature annealing treatment in a nitrogen atmosphere. The temperature at which the high temperature annealing treatment is performed is, for example, 400° C. to 500° C. The time while the high temperature annealing treatment is performed is, for example, about one hour. The high temperature annealing treatment may be performed in, for example, a clean dry air (CDA) atmosphere, in place of the nitrogen atmosphere.

Figure 15:
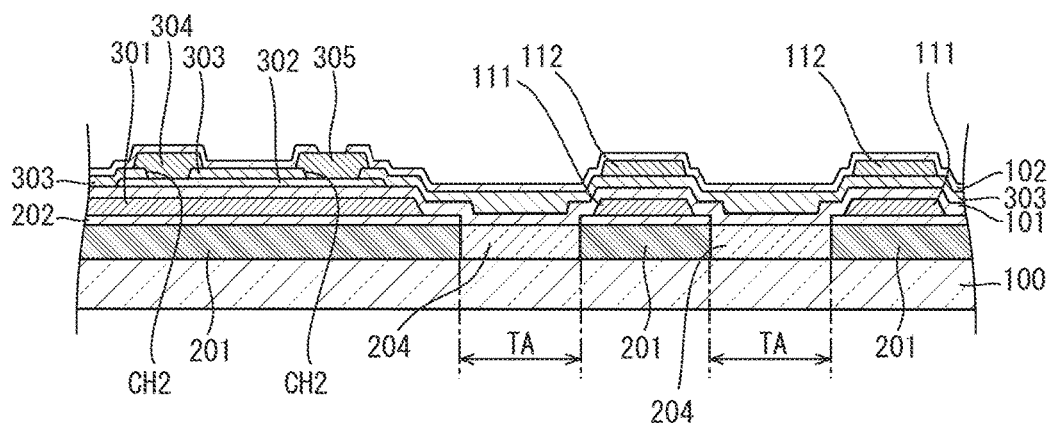
FIG. 15 is a diagram for explaining a method for manufacturing the first substrate, illustrating a state subsequent to the state illustrated in FIG. 14.

Next, as illustrated in FIG. 15, a $SiO_2$ film is formed by the PECVD method so as to cover the gate insulating film 101 and the oxide semiconductor film 302, whereby an etching stopper layer 303 is formed. The $SiO_2$ film has a thickness of, for example, 100 nm to 500 nm. Then, contact holes CH1, CH2 for allowing the source electrode 304 and the drain electrode 305 of the TFT 300 to reach the oxide semiconductor film 302 are formed.

Subsequently, a single layer film or a laminate film composed of any metal film such as an aluminum (Al) film, a tungsten (W) film, a molybdenum (Mo) film, a tantalum (Ta) film, a chromium (Cr) film, a titanium (Ti) film, a copper (Cu), or the like, or a film containing an alloy of any of the foregoing metals, is laminated by the sputtering method, whereby the second conductive film M2 is formed. Then, the second conductive film M2 is patterned by photolithography, whereby the source electrodes 304, the drain electrodes 305, the lines 112, signal lines (not shown), and the like, are formed. The second conductive films M2 have a thickness of, for example, 50 nm to 500 nm.

Next, a $SiO_2$ film is formed by the PECVD method so as to cover the gate insulating film 101 and the oxide semiconductor film 302, whereby the passivation film 102 is formed. The $SiO_2$ film has a thickness of, for example, 100 nm to 500 nm.

Figure 16:
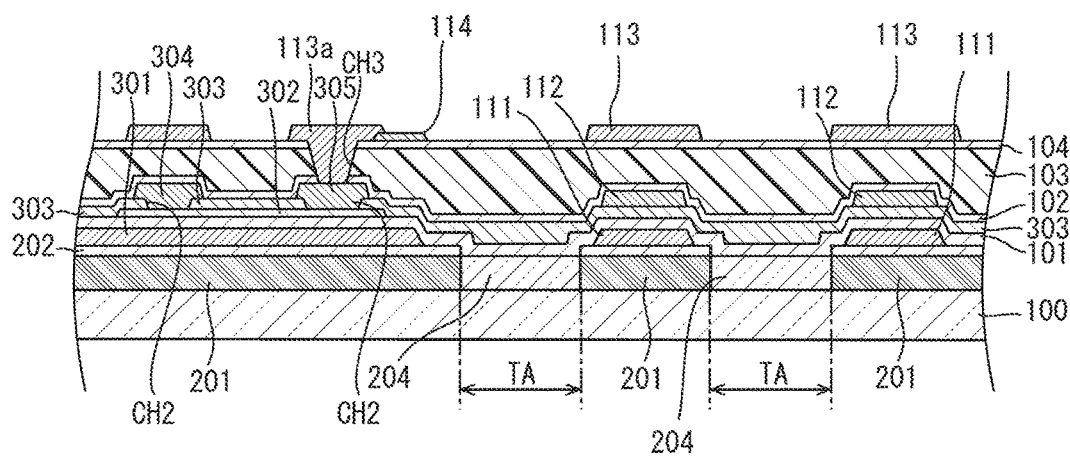
FIG. 16 is a diagram for explaining a method for manufacturing the first substrate, illustrating a state subsequent to the state illustrated in FIG. 15.

Next, as illustrated in FIG. 16, a photosensitive resin film is formed by the spinning method, whereby the flattening film 103 is formed. Here, the flattening film 103 formed has a thickness of, for example, 0.5 μm to 3 μm.

Next, an $SiN_x$ film is formed by the PECVD method so as to cover the flattening film 103, whereby the passivation film 104 is formed. The $SiN_x$ film has a thickness of, for example, 100 nm to 500 nm. Then, by etching the passivation film 102, the flattening film 103, and the passivation film 104, a contact hole CH3 that reaches the drain electrodes 305 from the surface of the passivation film 104 are formed.

Next, on the surface of the passivation film 104, and in the vicinity of the contact hole CH3, a transparent conductive film 114 is formed by, for example, the sputtering method.

Subsequently, a single layer film or a laminate film composed of any of a metal film such as an aluminum (Al) film, a tungsten (W) film, a molybdenum (Mo) film, a tantalum (Ta) film, a chromium (Cr) film, a titanium (Ti) film, a copper (Cu), or the like, or a film containing an alloy of any of the foregoing metals, is laminated by the sputtering method, whereby the third conductive film M3 is formed. Then, the third conductive film M3 is patterned by photolithography, whereby the lines 113 and the like are formed in areas other than the light-transmitting areas TA.

Figure 17:
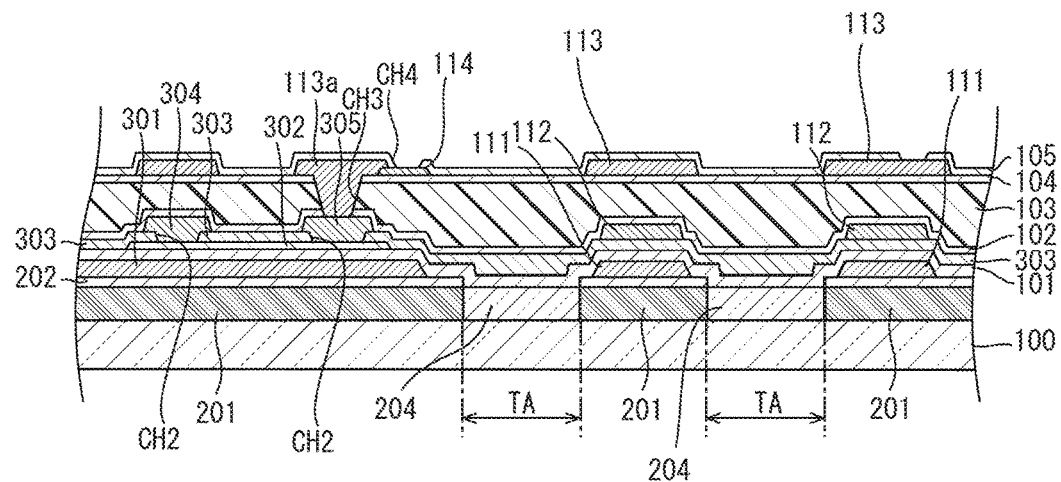
FIG. 17 is a diagram for explaining a method for manufacturing the first substrate, illustrating a state subsequent to the state illustrated in FIG. 16.

Next, as illustrated in FIG. 17, an $SiN_x$ film is formed by the PECVD method on the passivation film 104 so as to cover the lines 113, the transparent conductive films 114, and the like, whereby the passivation film 105 is formed. The $SiN_x$ film thus obtained has a thickness of, for example, 100 nm to 500 nm. Then, by etching the passivation film 105, a contact hole CH4 that reaches the transparent conductive film 114 from the surface of the passivation film 105 is formed.

Figure 18:
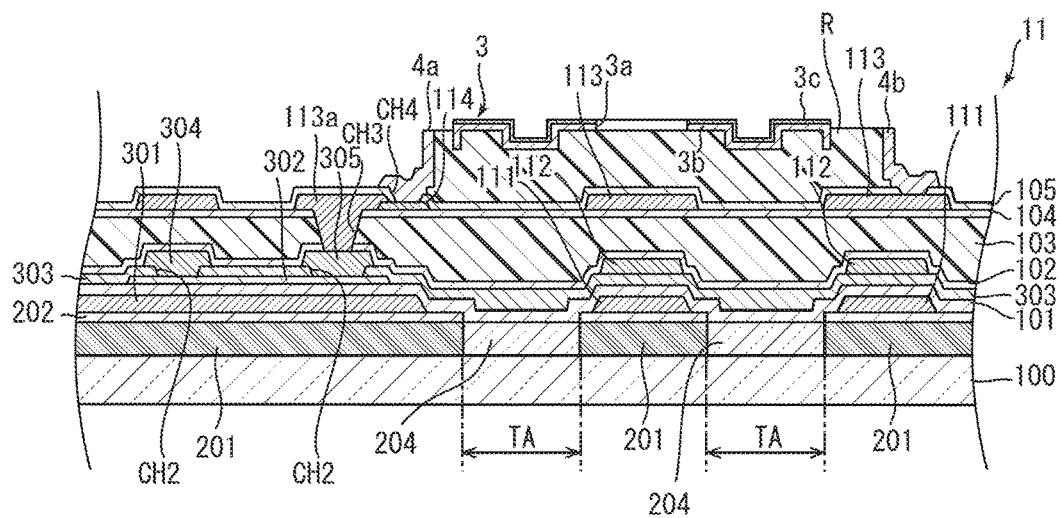
FIG. 18 is a diagram for explaining a method for manufacturing the first substrate, illustrating a state subsequent to the state illustrated in FIG. 17.

Next, as illustrated in FIG. 18, a resist R is coated over areas including at least the light-transmitting areas TA by, for example, the spin coating method.

Next, an amorphous silicon (a-Si) layer is formed by the PECVD method so as to cover the resist R. Here, the film is formed so as to cover both of the upper surfaces and the side surfaces of the resist R. The a-Si layer formed has a thickness of, for example, 200 nm to 500 nm. Then, the a-Si layer is patterned by photolithography, whereby the first electrode portion 4a, the second electrode portion 4b, the shutter beams 51, 52 (not shown in FIG. 18), and the shutter main body 3b are formed. The first electrode portion 4a and the second electrode portion 4b are composed of portions of the a-Si layer formed on the side surfaces of the resist R.

Subsequently, a metal film 3c is provided so as to form a layer above the shutter main body 3b. The metal film 3c is formed by laminating a metal film such as an aluminum (Al)

film, a tungsten (W) film, a molybdenum (Mo) film, a tantalum (Ta) film, a chromium (Cr) film, a titanium (Ti) film, a copper (Cu), or the like, or a film containing an alloy of any of the foregoing metals, by, for example, the sputtering method. Thus, the shutter body 3 is formed.

Figure 19:
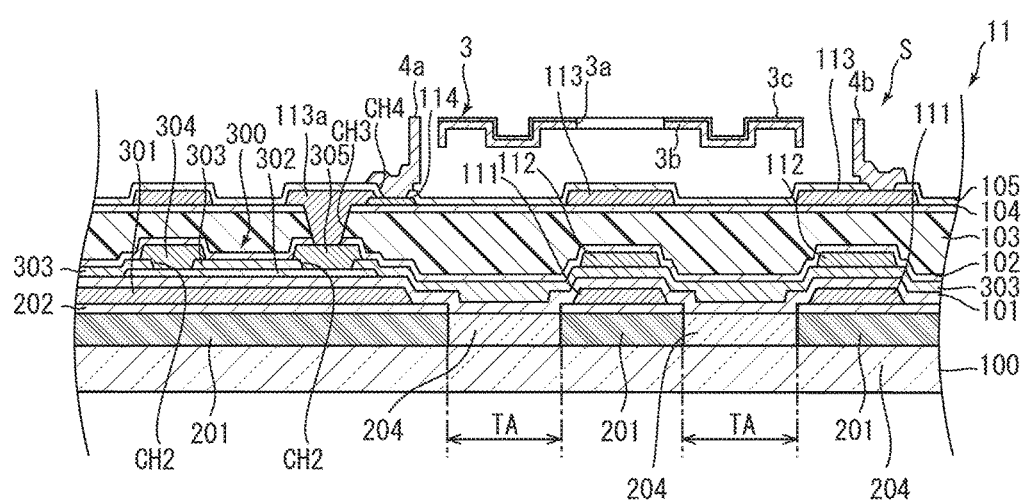
FIG. 19 is a diagram for explaining a method for manufacturing the first substrate, illustrating a state subsequent to the state illustrated in FIG. 18.

Finally, as illustrated in FIG. 19, the resist R is removed by the spinning method. This causes the shutter body 3 to be arranged in a state of being floated from the passivation film 105, with a space therebetween. The shutter body 3 is supported by the shutter beam anchors 81, 82, via the shutter beams 51, 52.

Through the above-described steps, the first substrate 11 is produced.

As described above, the method for manufacturing a display device in the present embodiment includes: a first step of forming the dark color film 250 with a transparent base material containing carbon particles, with which the film is colored, on the substrate (translucent substrate 100); a second step of forming an inorganic film (transparent insulating film 202) in an area that is to be a light-shielding area, in the area on the dark color film 250; and a third step of oxidizing carbon particles in a portion of the dark color film 250, the portion being in an area where the inorganic film (transparent insulating film 202) is not formed, so as to make the carbon particles in the portion transparent. Through these first to third steps, the area where the inorganic film (transparent insulating film 202) is formed is made a light-shielding area, and the areas where no inorganic film (transparent insulating film 202) is formed are made light-transmitting areas, in the dark color film 250.

This therefore make unnecessary the following steps after forming a light-shielding film on the substrate: the step of removing the light-shielding film from the light-transmitting area; and the step of forming a light-transmitting film for flattening the area from which the light-shielding film is removed. Accordingly, the number of steps in the display device manufacturing process can be reduced. Besides, since a light-transmitting film for flattening is unnecessary, the manufacturing cost can be reduced.

The above-described embodiment is merely an example for implementing the present invention. The present invention, therefore, is not limited by the above-described embodiment, and the above-described embodiment can be appropriately varied and implemented without departing from the spirit and scope of the invention.

For example, in the above-described embodiment, the transparent insulating film 202 may be a silicon-based inorganic film containing oxygen ($SiO_2$ film), a silicon nitride film containing nitrogen ($SiN_x$ film), or a laminate film of these films. The method for forming the transparent insulating film 202 is not limited to the PECVD method, but another method such as the sputtering method may be used instead.

The foregoing description states that the semiconductor layer of the TFT 300 is made of a compound (In—Ga—Zn—O) composed of indium (In), gallium (Ga), zinc (Zn), and, oxygen (O), but the present invention is not limited to this. The semiconductor layer of the TFT 300 may be made of a compound (In-Tin-Zn—O) containing indium (In), tin (Tin), zinc (Zn), and oxygen (O), or alternatively, a compound (In—Al—Zn—O) containing indium (In), aluminum (Al), zinc (Zn), and oxygen (O), or another compound.

The display device of the above-described embodiment is a transmission type MEMS display, but the method for manufacturing a display device according to the present invention can be applied to a reflection-type MEMS display.

It is possible to apply the method for manufacturing the display device according to the present invention to an organic electroluminescence display (hereinafter referred to as "organic EL display"), too. In particular, in a bottom emission type organic EL display, it is useful to form a light-shielding film on a display viewing side of conductive films, in order to prevent external light advancing from the display viewing side into the display device from being reflected on the conductive films such as the gate lines and the data lines. The light-shielding film is formed so as to be superposed on at least the gate lines and the data lines when viewed in the direction vertical to the active matrix substrate. This light-shielding film can be formed by the method described in the foregoing descriptions of the embodiments.

The method for manufacturing the display device according to the present invention can be applied to a see-through-type liquid crystal display that allows an object that is present on the back side of the liquid crystal display to be seen through the liquid crystal display. This is because, in the see-through-type liquid crystal display as well, it is useful to form the light-shielding film on the display viewing side of conductive films, in order to prevent external light advancing from the display viewing side into the display device from being reflected on the conductive films such as gate lines and the data lines. The light-shielding film is formed so as to be superposed on at least the gate lines and the data lines when viewed in the direction vertical to the substrate. This light-shielding film, therefore, can be formed by the method described in the foregoing descriptions of the embodiments. Further, the method for manufacturing the display device according to the present invention can be applied to a liquid crystal display other than the see-through-type liquid crystal display.

In a liquid crystal display or an organic EL display, a black matrix is provided so as to prevent light leakage or color mixing between pixels. The black matrix can be formed by the above-described method. More specifically, the method for manufacturing a display device according to the present invention can be applied to a variety of display devices having such a substrate that light-transmitting areas that allow light to pass therethrough, and a light-shielding area that blocks light, are formed in a display region for displaying an image, for example, a MEMS display, a liquid crystal display, an organic EL display, and the like. In this case, a method for manufacturing a display device includes a first step of forming a dark color film with a transparent base material containing carbon particles, with which the film is colored, on the substrate; a second step of forming an inorganic film in an area that is to be a light-shielding area, in the area on the dark color film; and a third step of oxidizing carbon particles in portions of the dark color film, the portions being in areas where the inorganic film is not formed, so as to make the carbon particles in the portion transparent. Through the first, second, and third steps, in the dark color film, the area where the inorganic film is formed is made a light-shielding area, and the areas where no inorganic film is formed are made light-transmitting areas.

DESCRIPTION OF REFERENCE NUMERALS

10: display device
11: first substrate
13: display region
15: data line
16: gate line
21: second substrate
100: translucent substrate 101: gate insulating film
201: light-shielding film
202: transparent insulating film (inorganic film)
204: light-transmitting film
250: dark color film
300: TFT (thin film transistor)

The invention claimed is:

1. An active matrix substrate comprising an insulating substrate in which light-transmitting areas that allow light to pass therethrough, and a light-shielding area that blocks light are formed, the active matrix substrate further comprising:
    a light-shielding film formed in the light-shielding area on the insulating substrate, with a transparent base material containing carbon particles, the light shielding film being colored with the carbon particles;
    an inorganic film formed on the light-shielding film;
    light-transmitting films formed in the light-transmitting areas on the insulating substrate, with a transparent base material containing transparent oxidized carbon particles;
    gate lines provided on the inorganic film;
    a gate insulating film provided on the gate lines;
    thin film transistors provided in matrix on the gate insulating film; and
    data lines provided on the light-shielding film so as to intersect with the gate lines, the data lines being electrically connected with the thin film transistors.

2. The active matrix substrate according to claim 1, wherein each light-transmitting film is provided exclusively between portions of the light-shielding film, in a horizontal direction of the active matrix substrate.

3. The active matrix substrate according to claim 1, wherein the light-transmitting film is a transparent film obtained from a part of the light-shielding film colored with the carbon particles, the transparent film being obtained by oxidizing the carbon particles contained in the transparent base material of the light-shielding film so as to make the carbon particles transparent.

4. The active matrix substrate according to claim lam one of claims 1,
    wherein, in an outer peripheral portion of a display region, the light-shielding film has an end edge that forms a surface inclined with respect to the substrate, and an angle formed between the inclined surface and the substrate is 3° to 10°.

5. The active matrix substrate according to claim 1 4,
    wherein the inorganic film is formed in the light-shielding area, when viewed in a direction vertical to the active matrix substrate.

6. The active matrix substrate according to claim 1,
    wherein the thin film transistors contain an oxide semiconductor.

7. A display device comprising the active matrix substrate according to claim 1.

8. The display device according to claim 7, further comprising:
    shutter mechanism parts formed in an upper layer with respect to the inorganic film; and
    a backlight provided so as to be opposed to the substrate, with the shutter mechanism parts being interposed therebetween,
    wherein the light-transmitting areas are formed so as to allow light from the backlight pass therethrough, through an opening in the shutter mechanism parts.

9. The display device according to claim 8, the display device being a MEMS display.

10. The display device according to claim 7, the display device being an organic electroluminescence display.

11. The display device according to claim 7, the display device being a liquid crystal display.

12. A method for manufacturing a display device that includes a substrate in which, in a display region for displaying an image, light-transmitting areas that allow light to pass therethrough, and a light-shielding area that blocks light are formed, the method comprising the steps of:
    on the substrate, forming a dark color film that is formed with a transparent base material containing carbon particles, the dark color film being colored with the carbon particles;
    forming an inorganic film in an area that is to become the light-shielding area, in an area on the dark color film; and
    oxidizing the carbon particles in areas where the inorganic film is not formed, in the dark color film, so as to make the carbon particles transparent.

13. The method for manufacturing a display device according to claim 12,
    wherein, after the inorganic film formed in the area that is to become the light-shielding area, the dark color film is fired at 400° C. or higher, whereby the carbon particles are oxidized in the areas where the inorganic film is not formed, in the dark color film.

14. The method manufacturing a display device according to claim 13,
    wherein the transparent base material is a resin or an SOG material having a melting point higher than a temperature at which the dark color film is fired.

* * * * *